United States Patent [19]

Nakamura et al.

[11] 4,197,130

[45] Apr. 8, 1980

[54] PHOTOSENSITIVE ELASTOMERIC COMPOSITION AND ELEMENT

[75] Inventors: Shohei Nakamura, Fuji; Kenichi Morotomi, Kawasaki, both of Japan

[73] Assignees: Asahi Kasei Kogyo Kabushiki Kaisha, Osaka, Japan; Asahi Kasei Kogyo Kabushiki Kaisha, Osaka, Japan

[21] Appl. No.: 894,064

[22] Filed: Apr. 6, 1978

[30] Foreign Application Priority Data

Apr. 11, 1977 [JP] Japan ................................. 52-41251

[51] Int. Cl.$^2$ .............................................. G03C 1/68
[52] U.S. Cl. .................... 430/286; 430/496; 430/627; 430/913
[58] Field of Search ............... 96/119 P, 115 R, 87 R, 96/67; 204/159.15, 159.19

[56] References Cited

U.S. PATENT DOCUMENTS

| 3,031,301 | 4/1962 | Agens ................................. 96/115 P |
| 3,265,765 | 8/1966 | Holden et al. ..................... 260/876 B |
| 3,912,516 | 10/1975 | Recchia et al. ......................... 96/87 R |
| 3,951,657 | 4/1976 | Recchia et al. ......................... 96/35.1 |

FOREIGN PATENT DOCUMENTS 1366769  9/1974  United Kingdom .................. 96/115 P

*Primary Examiner*—Jack P. Brammer
*Attorney, Agent, or Firm*—Sprung, Felfe, Horn, Lynch & Kramer

[57] ABSTRACT

A novel photosensitive elastomeric composition comprising a thermoplastic elastomeric block copolymer, an ethylenically unsaturated compound derived from fumaric acid or maleic acid and a photopolymerization initiator. The composition of the present invention is excellent in various properties, especially in heat stability. The composition of the present invention is useful, especially for the manufacture of flexographic printing elements.

10 Claims, No Drawings

PHOTOSENSITIVE ELASTOMERIC COMPOSITION AND ELEMENT

This invention relates to a novel photosensitive elastomeric composition. More particularly, the invention relates to a photosensitive elastomeric composition which is useful especially for the manufacture of flexographic printing elements.

Flexographic printing reliefs have heretofore been prepared according to the process comprising etching a metal plate to form a master, making a matrix of a plastic material using the master and then casting a rubbery material into the matrix and heating the rubbery material under pressure to effect curing and to form a rubber plate. Since the etching of the metal plate provides a deeply etched portion and a less deeply etched portion, when a flexographic printing relief is directly formed using the etched metal plate, the thickness of the obtained relief is not uniform in its ink-receiving portions. Therefore, it is indispensable to perform an intermediate step of forming a plastic matrix using the master. Accordingly, this process is defective in that the process requires a great expense and a long time. Moreover, since a pattern or design is transferred twice, no high precision can be attained in the resulting rubber plate. Furthermore, the back face of the rubber plate must be shaved to render the thickness uniform in the ink-receiving portion of the rubber plate when the rubber plate is actually used.

With a view to overcoming these defects, there has recently been proposed a process in which a flexographic printing plate or relief is directly prepared using a photosensitive elastomeric composition.

For example, in U.S. Pat. Nos. 2,948,611 and 3,024,180, there is proposed a process in which a flexographic printing plate is prepared using a photosensitive layer composed of a photosensitive elastomeric composition comprising as main components an elastomeric polymer such as a chloroprene rubber or a polyurethane rubber, an ethylenically unsaturated compound having a terminal ethylenic double bond and a photopolymerization initiator. Printing plates prepared according to this process are inferior to conventional molded rubber plates in elasticity and flexibility, and the layer of the photosensitive elastomeric composition is defective in that cold flow is readily caused. Accordingly, this process still involves problems to be solved.

Further, various photosensitive elastomeric compositions comprising a polyurethane elastomer, an ethylenically unsaturated compound and a photopolymerization initiator are proposed in British Pat. No. 1,451,251, U.S. Pat. Nos. 3,951,657, 3,912,516 and French Pat. No. 2,104,217. In general, flexographic printing is carried out using an organic solvent based ink containing mainly an alcohol as the solvent. A printing plate prepared from a photosensitive elastomeric composition comprising a polyurethane type elastomer is poor in resistance to an organic solvent, and therefore, it can be used only in a very special field, for example, for printing with the use of an aqueous printing ink.

In Japanese Patent Application Publication No. 43374/1976 corresponding to British Pat. No. 1,366,769, there is proposed a process in which in order to obviate defects involved in the above photosensitive elastomeric compositions, such as poor solvent resistance, occurrence of cold flow and poor elasticity, a thermoplastic elastomeric block copolymer comprising at least two thermoplastic non-elastomeric polymer blocks having a glass transition temperature above 25° C. and between the thermoplastic non-elastomeric polymer blocks an elastomeric polymer block having a glass transition temperature below 10° C., is used as the thermoplastic elastomeric copolymer in the photosensitive composition. In a printing plate prepared using this copolymer, defects of a printing plate of a polyurethane type elastomer, for example, poor solvent resistance, can be obviated. However, since in the composition including such a copolymer an ethylenically unsaturated compound containing at least one terminal ethylenic group is used as an indispensable component for rendering the composition photopolymerizable and modifying physical properties thereof, the composition is poor in heat stability and it is often rendered insoluble in solvents at the heating and molding step for production of a light-unexposed plate or during the storage at a relatively high temperature, even if a heat polymerization inhibitor is incorporated. Therefore, the quality of a printing plate prepared from this photosensitive elastomeric composition is reduced, and in an extreme case, no relief can be formed at all.

It is a principal object of this invention to provide an excellent photosensitive elastomeric composition which is free of the above-mentioned defects accompanying the conventional photosensitive elastomeric compositions.

Another object of this invention is to provide an excellent photosensitive element comprising an excellent photosensitive elastomeric composition of the kind described above.

We made researches with a view to obviating the defects involved in the conventional photosensitive elastomeric compositions for production of flexographic printing plates, and as a result, it was found that moldability, heat stability, resistance to cold flow, solvent resistance, rubber elasticity, toughness, fidelity to an original transparency and resolution as a printing plate are surprisingly improved by the use of the photosensitive elastomeric composition as described below, in addition to a relatively low cost thereof. Based on this finding, we have now completed the present invention.

According to this invention, there is provided a photosensitive elastomeric composition comprising as a component (a) at least one thermoplastic elastomeric block copolymer represented by the following general formula:

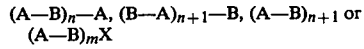

wherein A stands for a thermoplastic non-elastomeric polymer block having a glass transition temperature of 25° C. or more, B stands for an elastomeric polymer block having a glass transition temperature of 10° C. or less, X stands for Sn or Si, n is an integer of from 1 to 10, and m is 2 or 4, as a component (b) at least one ethylenically unsaturated compound represented by the following general formula:

wherein $R^1$ and $R^2$, which may be the same or different, stand for a straight chain or branched alkyl group having 2 to 30 carbon atoms, an aryl group which is a phenyl group or a naphthyl group unsubstituted or substituted with one or two straight chain or branched alkyl groups having 1 to 6 carbon atoms or an aralkyl group represented by the formula $-(CH_2)_p-Ar$ wherein p is an integer of from 1 to 6 and Ar is a phenyl group unsubstituted or substituted with one or two straight chain or branched alkyl groups having 1 to 3 carbon atoms, and as a component (c) a photopolymerization initiator. In the thermoplastic elastomeric block copolymer represented by the following general formula:

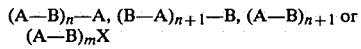

$(A-B)_n-A$, $(B-A)_{n+1}-B$, $(A-B)_{n+1}$ or $(A-B)_m X$ wherein A stands for a thermoplastic non-elastomeric polymer block having a glass transition temperature of 25° C. or more, B stands for an elastomeric polymer block having a glass transition temperature of 10° C. or less, X stands for Sn or Si, n is an integer of from 1 to 10, and m is 2 or 4, that is used in the present invention, preferably, the block A are those formed by polymerizing alkenyl aromatic hydrocarbons, preferably vinyl substituted aromatic hydrocarbons and still more preferably vinyl monocyclic aromatic hydrocarbons, while the block B are polymers of aliphatic conjugated diolefins. Particularly preferably, as the block A there can be mentioned polystyrene and poly(α-methylstyrene) and as the block B there can be mentioned polybutadiene and polyisoprene.

As specific examples of $(A-B)_n-A$, there can be mentioned polystyrene-polybutadiene-polystyrene, polystyrene-polyisoprene-polystyrene, poly(α-methylstyrene)-polybutadiene-poly(α-methylstyrene), polystyrene-polybutadiene-polystyrene-polybutadiene-polystyrene, polystyrene-polybutadiene-polystyrene-polybutadiene-polystyrene-polybutadiene-polystyrene and its analogous block copolymers in which the frequency n of the recurring units (A—B) is up to 10.

As specific examples of $(B-A)_{n+1}-B$, there can be mentioned polybutadiene-polystyrene-polybutadiene-polystyrene-polybutadiene, polyisoprene-polystyrene-polyisoprene-polystyrene-polyisoprene and its analogous block copolymers in which the frequency n of the recurring units (B—A) is up to 10.

As specific examples of $(A-B)_{n+1}$, there can be mentioned polystyrene-polybutadiene-polystyrene-polybutadiene, polystyrene-polyisoprene-polystyrene-polyisoprene, poly(α-methylstyrene)-polybutadiene-poly(α-methylstyrene)-polybutadiene, polystyrene-polybutadiene-polystyrene-polybutadiene-polystyrene-polybutadiene and its analogous block copolymers in which the frequency n of the recurring units (A—B) is up to 10.

As specific examples of $(A-B)_m X$, there can be mentioned (polystyrene-polybutadiene)$_4$Si, (polystyrene-polyisoprene)$_4$Si and (polystyrene-polybutadiene)$_2$Sn.

As examples of the thermoplastic elastomeric block copolymers that may be used in the present invention, there can also be mentioned those disclosed in U.S. Pat. No. 3,265,765 and British Pat. No. 1,366,769. These copolymers may be used alone or in combination.

Of these copolymers, from the viewpoints of the rubber elasticity and easiness in availability, copolymers in which n is 1 are preferred. For example, there may preferably be employed polystyrene-polyisoprene-polystyrene, polystyrene-polybutadiene-polystyrene and polystyrene-polybutadiene-polystyrene-polybutadiene.

For the same reasons, (polystyrene-polybutadiene)$_4$Si is preferred of copolymers represented by the general formula $(A-B)_m X$.

The above-mentioned thermoplastic elastomeric block copolymers have rubber elasticity even in the uncured state due to physical crosslinking of the thermoplastic non-elastomeric polymer blocks interposing the elastomeric polymer block and hence cold flow does not occur. But if the molecular weight of the thermoplastic non-elastomeric polymer block is too small, the physical crosslinking of the block copolymer becomes insufficient. On the other hand, if the molecular weight of said block is too large, the rubber elasticity of the block copolymer becomes insufficient. With respect to the elastomeric polymer block, if the molecular weight thereof is too small, said polymer block cannot impart a sufficient rubber elasticity to the block copolymer, while if the molecular weight is too large, there is caused degradation of the physical crosslinking of the block copolymer. If the total molecular weight of the block copolymer is too large, the thermoplasticity thereof is caused to be small, leading to poor heat moldability. In view of the foregoing, it is preferred that the number average molecular weight of the thermoplastic non-elastomeric polymer block be 2,000 to 100,000 and the number average molecular weight of the elastomeric polymer block be 25,000 to 1,000,000. For the measurement of a number average molecular weight, there is adopted a gel permeation chromatography (GPC) method using, as a standard sample, a polystyrene manufactured by Pressure Chemical Co., U.S.A. and as an apparatus, WATERS 200 manufactured by Japan-Waters Co., Japan.

The thermoplastic elastomeric block copolymer can be easily prepared, for example, according to the method as described in U.S. Pat. No. 3,265,765. Taking as an example the case of the preparation of (polystyrene-polyisoprene)$_n$-polystyrene, explanation will be made. sec-Butyl lithium is added to a benzene solution of styrene so that living polymerization is effected to obtain a first reaction mixture containing polystyrene. Isoprene is then added to the first reaction mixture to effect polymerization, thereby to obtain a second reaction mixture containing polystyrene-polyisoprene. Styrene is again added to the second reaction mixture to effect polymerization, thereby to obtain a third reaction mixture containing polystyrene-polyisoprene-polystyrene. Further, isoprene and styrene are added one after the other to the third reaction mixture to effect polymerization, thereby to obtain the desired (polystyrene-polyisoprene)$_n$-polystyrene wherein n may be a desired integer. Anion radicals as active species in the living polymerization are inactivated by adding such a compound having a hydroxyl group as water, an alcohol or phenol at the end of the polymerization. $(B-A)_{n+1}-B$ and $(A-B)_{n+1}$ can be easily obtained according to the similar method as described above in which monomers corresponding to A and B are added one after the other to effect polymerization and the polymerization is stopped just after the intended block copolymer has been prepared. In the case of the preparation of $(A-B)_m X$, A—B is prepared as described above, followed by addition of, for example, SiCl$_4$ or SnCl$_2$ as an inactivating agent, to obtain the intended block copolymer.

The above-mentioned thermoplastic elastomeric block copolymers that may be employed in this invention have a rubber elasticity in the uncured state, and do not show any flowability at room temperature and hence cold flow is not caused but they are rendered flowable by heating. A sheet comprising a photosensitive elastomeric composition layer for a flexographic printing plate is ordinarily stored for a relatively long period between the sheet-preparing step and the printing plate-preparing step. Therefore, if cold flow is caused during the storage, the thickness of the sheet becomes uneven and the sheet cannot be practically used for the production of a printing plate. Accordingly, it is required that the copolymer component (a) should not show any flowability at room temperature and it is also required that the mixing ratio of the copolymer component (a) in the photosensitive elastomeric composition should be such that a property that cold flow does not take place is maintained in the photosensitive elastomeric composition. From this viewpoint, it is preferred that the copolymer component (a) be incorporated in an amount of at least 30% by weight and it is possible to incorporate the copolymer component (a) in an amount up to 98% by weight. The amount of the copolymer component (a) may be varied depending on the intended physical properties of a printing plate, but from the viewpoints of the rubber elasticity and moldability, it is more preferred that the copolymer component (a) be incorporated in an amount of 55 to 95% by weight.

It is conceivable that crystalline 1,2-polybutadiene or polyurethane elastomer may be used as a thermoplastic elastomer in combination with other indispensable components of this invention instead of the thermoplastic elastomeric block copolymer that is used in this invention. However, crystalline 1,2-polybutadiene has a defect that the polymer is much inferior to the thermoplastic elastomeric block copolymer in respect of maintenances of rubber elasticity and storability, of the printing plate prepared from the polymer, between the time of the first use of the printing plate and that of the reuse thereof. The polyurethane elastomer has such a fatal defect as the aforementioned poor solvent resistance, and the photosensitivity of a composition comprising the polyurethane elastomer and the ethylenically unsaturated compound that is used in this invention is unsatisfactory. Accordingly, the use of such rystalline 1,2-polybutadiene or polyurethane elastomer is not preferred.

In the present invention, an ethylenically unsaturated compound represented by the following general formula:

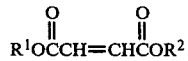

wherein $R^1$ and $R^2$, which may be the same or different, stand for a straight chain or branched alkyl group having 2 to 30 atoms, an aryl group which is a phenyl group or a naphthyl group unsubstituted or substituted with one or two straight chain or branched alkyl groups having 1 to 6 carbon atoms or an aralkyl group represented by the formula $-(CH_2)_p-Ar$ wherein p is an integer of from 1 to 6 and Ar is a phenyl group unsubstituted or substituted with one or two straight chain or branched alkyl groups having 1 to 3 carbon atoms, is used as the component (b) to be combined with the thermoplastic elastomeric block copolymer (a). In the above formula, examples of $R_1$ and $R_2$ include straight chain or branched alkyl groups having 2 to 30 carbon atoms, such as an ethyl group, propyl groups, butyl groups, pentyl groups, hexyl groups, heptyl groups, octyl groups, nonyl groups, decyl groups and lauryl groups; aryl groups such as a phenyl group, tolyl groups, dimethylphenyl groups, ethylphenyl groups, diethylphenyl groups, propylphenyl groups, butylphenyl groups, pentylphenyl groups, hexylphenyl groups, naphthyl groups, methylnaphthyl groups, ethylnaphthyl groups, and propylnaphthyl groups; and aralkyl groups such as a benzyl group, a phenylethyl group, tolylmethyl groups, dimethylphenylmethyl groups, phenylpropyl groups, tolylethyl groups, phenylbutyl groups, tolylbutyl groups, phenylpentyl groups, phenylhexyl groups and tolylhexyl groups. As specific examples of the ethylenically unsaturated compound (b), there can be mentioned diethyl fumarate, dibutyl fumarates, dioctyl fumarates, didecyl fumarates, dilauryl fumarate, distearyl fumarate, butyl octyl fumarates, lauryl stearyl fumarate, diphenyl fumarate, ditolyl fumarates, bis(ethylphenyl) fumarates, bis(dimethylphenyl) fumarates, bis(hexylphenyl) fumarates, dinaphthyl fumarates, bis(methylnaphthyl) fumarates, dibenzyl fumarate, bis(3-phenylpropyl) fumarate, bis(6-phenylhexyl) fumarate, bis(2-phenylethyl) fumarate, dibutyl maleates, dioctyl maleates, didecyl maleates, diphenyl maleate, ditolyl maleates, dilauryl maleate, distearyl maleate, dibenzyl maleate and bis(6-phenylhexyl) maleate. However, ethylenically unsaturated compounds that may be used in the present invention are not limited to compounds exemplified above. These compounds may be used alone or in combination.

The ethylenically unsaturated compound represented by the above formula that is used as the component (b) in the present invention, is a diester of fumaric acid or maleic acid as described above. In the case where a diester of maleic acid is used, no disadvantage or trouble is caused when it is handled at a low temperature, but at the kneading and molding step at a high temperature, the diester is partially subjected to thermal transition to form in part a diester of fumaric acid, and therefore the quality of the photosensitive elastomeric composition is varied lot to lot. Accordingly, it is preferred to use diesters of fumaric acid. When $R^1$ and $R^2$ is an aryl or aralkyl group, the component (b) plasticizes the non-elastomeric polymer block of the thermoplastic elastomeric block copolymer (a) to loosen the degree of physical crosslinking, resulting in reduction of the physical properties of the photosensitive elastomeric composition. Accordingly, it is preferred that $R^1$ and $R^2$ be alkyl groups. If the carbon number of the alkyl group as $R^1$ or $R^2$ is too small, the smell of the ethylenically unsaturated compound (b) is strong and owing to reduction of compatibility of the component (b) with the component (a), the component (b) is present in the form of particles. Namely, the resulting composition becomes opaque, and the resolution of the sheet comprising the composition is degraded. In some case, moreover, bleeding takes place during storage. In the case of the ethylenically unsaturated compound where the carbon number of the alkyl group is too large, the starting alcohol is hardly available and it must be customized or prepared particularly. Accordingly, the cost of the photosensitive elastomeric composition is increased. In veiw of the foregoing, it is required that the carbon number of the alkyl group as $R^1$ or $R^2$ be 2 to 30, preferably 4 to 18, more preferably 8 to 18.

In general, an ethylenically unsaturated compound having at its terminal or terminals a vinyl group such as an acryl, methacryl or allyl group has a high reactivity to polymerization, but it has such a defect as poor heat stability. For improving the heat stability, it is conceivable that an ethylenically unsaturated compound having a low reactivity is used. However, in this case, other disadvantages such as reduction of the photosensitivity and the degradation of physical properties of a cured printing plate are caused. Therefore, such an ethylenecially unsaturated compound cannot be practically used.

None of vinyl groups such as acryl, methacryl and allyl groups are present at the molecule terminals of the ethylenically unsaturated compound that is used in the present invention, leading to a high heat stability. To our great surprise, it was found that the reactivity of this ethylenically unsaturated compound is higher than that of a terminal vinyl type ethylenically unsaturated compound.

A photosensitive composition formed by combining the ethylenically unsaturated compound as used in the present invention with a polyurethane elastomer or an unsaturated polyester is inferior in photosensitivity to a photosensitive composition formed by combining an ethylenically unsaturated compound having at its terminal or terminals a vinyl group such as an acryl, methacryl or allyl group with a polyurethane elastomer or an unsaturated polyester, and such a composition cannot be put into practical use. In contrast, a photosensitive composition formed by combining the ethylenically unsaturated compound as used in the present invention with the thermoplastic elastomeric block copolymer as used in the present invention is characterized in that it has a sufficient photosensitivity from a practical point of view and in that it is excellent in the reactivity and heat stability over a known photosensitive elastomeric composition comprising an ethylenically unsaturated compound having at its terminal or terminals a vinyl group such as an acryl, methacryl or allyl group and a thermoplastic elastomeric block copolymer, such as disclosed in British Pat. No. 1,366,769.

The ethylenically unsaturated compound to be used in the present invention is incorporated in order to impart a reactivity to the photosensitive elastomeric composition and in order to improve physical properties of the composition after curing. The amount of the ethylenically unsaturated compound may be varied depending on the kind of said unsaturated compound and the intended properties of the flexographic printing plate to be produced, but it is preferred that the ethylenically unsaturated compound be added in an amount of at least 1% by weight. It is possible to increase the amount of the ethylenically unsaturated compound to 50% by weight. If the amount of the ethylenically unsaturated compound is smaller than 1% by weight, the resulting composition may not be sufficiently cured by actinic radiation and no sufficient solvent insolubility is attained. Therefore, a part of an area to be formed as a relief is washed away at the solvent etching step which is conducted after the imagewise exposure to actinic radiation and a satisfactory printing plate cannot be obtained. On the other hand, if the amount of the ethylenically unsaturated compound is too large, the resulting printing plate may be hard or brittle and poor in rubber elasticity, and in some case, the printing plate cannot be used for flexographic printing. A more preferred amount of the ethylenically unsaturated compound is in the range of from 5 to 30% by weight.

As the photopolymerization initiator effective for the photosensitive elastomeric composition of the present invention, there can be mentioned, for example, benzophenone, Michler's ketone, benzoin, benzoin methyl ether, benzoin ethyl ether, benzoin isopropyl ether, benzoin isobutyl ether, α-methylolbenzoin, α-methylolbenzoin methyl ether, α-methoxybenzoin methyl ether, benzoin phenyl ether, α-t-butylbenzoin, 2,2-dimethoxy-2-phenylacetophenone, 2,2-diethoxyacetophenone, benzil, pivaloin, anthraquinone, benzanthraquinones, 2-ethylanthraquinone and 2-chloroanthraquinone. The photopolymerization initiator may be added in an effective amount for polymerization, i.e., 0.01 to 10% by weight, preferably 0.1 to 2% by weight.

The photosensitive elastomeric composition of this invention may further comprise 0.001 to 2% by weight of a heat polymerization inhibitor. As such heat polymerization inhibitors, there can be mentioned, for example, 2,6-di-t-butyl-p-cresol, p-methoxyphenol, pentaerythritol tetrakis[3-(3',5'-di-t-butyl-4'-hydroxy)phenylpropionate], hydroquinone, t-butylcatechol, t-butylhydroxyanisole and 4,4'-butylidenebis(3-methyl-6-t-butyl)-phenol.

If desired, the photosensitive elastomeric composition of the present invention may comprise a plasticizer. In some cases, the plasticizer promotes removal of a light-unexposed area of the photosensitive elastomeric composition layer, renders physical properties such as hardness of the cured area desirable and facilitates kneading of the raw materials and formation or molding of the photosensitive elastomeric composition layer. The amount of the plasticizer may be varies in the range of 2 to 40% by weight according to the intended properties of the photosensitive elastomeric composition layer. As such plasticizers, there can be mentioned, for example, hydrocarbon oils such as naphthenic and paraffinic oils, low-molecular-weight polystyrene (having a number average molecular weight of 3,000 or less), α-methylstyrene-vinyltoluene copolymers, petroleum resins, penterythritol ester of hydrogenated rosin, polyterpene resins, polyester resins, polyethylene, poly(α-methylstyrene), polyacrylates, liquid 1,2-polybutadiene, liquid 1,4-polybutadiene, liquid acrylonitrilebutadiene copolymers, liquid styrene-butadiene copolymers, stearic acid, polypentadienes, polyurethanes and ethylene-propylene-diene rubbers.

The case where the photosensitive elastomeric composition of the present invention is used for production of a flexographic printing plate will now be explained by way of example. A layer of the photosensitive elastomeric composition usually has a thickness of 0.5 to 7.0 mm. The layer is held at one side of the surface thereof on a support, and a cover sheet is provided on the other side of the surface of the photosensitive composition layer remote from the support. This cover sheet is provided for preventing the surface of the photosensitive elastomeric composition layer from being damaged and/or stained during storage and manipulation. If desired, an adhesive layer may be interposed between the support and the photosensitive elastomeric composition layer, and a thin film layer or a thin, solvent-soluble, flexible layer may be interposed between the cover sheet and the photosensitive elastomeric composition layer.

As the support, there can be mentioned, for example, plates, sheets and foils of metals such as iron, steels and aluminum, and films and plates of synthetic resins such as polystyrene, polyester, polypropylene and polyamide resins. The thickness of the support is usually within the range of from 50μ to 3 mm, but may be more than 3 mm in a special case.

As the cover sheet, there can be mentioned, for example, films of transparent synthetic resins such as polystyrene, polyethylene, polypropylene and polyester resins. The thickness of the cover sheet may be within the range of from 50μ to 1 mm.

As the adhesive material of the adhesive layer, there may be employed, for example, those described in U.S. Pat. Nos. 2,760,863 and 3,036,913. The thickness of the adhesive layer may be within the range of from 0.5 to 100μ.

The photosensitive elestomeric composition of the present invention is sometimes sticky according to the recipe thereof. In order to attain good contact, without the generation of bubble, between the photosensitive elastomeric composition layer and an image-bearing transparency to be superposed thereon, and in order to enable the reuse of the image-bearing transparency while preventing the image-bearing transparency from being damaged by the stickiness of the photosensitive elastomeric composition when the transparency is separated, a laminated layer of a thin film of polyethylene, polypropylene, polyester or polystyrene may be provided on the surface of the photosensitive elastomeric composition layer. The thickness of the laminated layer may be within the range of from 5 to 40μ. Such a film is stripped off after light exposure through the image-bearing transparency disposed on the film has been completed. For the same purpose, a thin, solvent-soluble, flexible layer may be provided on the photosensitive elastomeric composition layer. This layer is removed simultaneously by dissolution when the light-unexposed area is dissolved away by a solvent after light exposure through the image-bearing transparency has been completed.

The photosensitive elastomeric composition plate or sheet of the present invention may be prepared according to various methods. For example, the raw materials of the photosensitive elastomeric composition are dissolved and mixed in an appropriate solvent such as chloroform, carbon tetrachloride, 1,1,1-trichloroethane, tetrachloroethylene, trichloroethylene, methyl ethyl ketone, methyl isobutyl ketone, toluene or tetrahydrofuran, and the resulting solution is cast in a mold and the solvent is then evaporated. Thus, a plate can be simply formed and used as such. When the so formed plate is heated and pressed, a plate having a high precision can be obtained. Alternatively, the raw materials of the photosensitive elastomeric composition are mixed using a kneader or a roll mill without the use of a solvent, and the resulting mixture is subjected to extrusion, injection, pressing or calendering to form a sheet having a desired thickness.

Lamination of the support and the cover sheet onto the so prepared photosensitive elastomeric composition plate or sheet may be done by roll laminating. If heat pressing is carried out after roll laminating, a photosensitive layer having a further improved precision can be obtained.

In order to provide a thin flexible layer, for example, a layer of crystalline 1,2-polybutadiene, soluble polyamide or partially saponified polyvinyl acetate, on the surface of the photosensitive layer, a solution of such a polymer in an appropriate solvent is coated on the surface of the photosensitive layer. Alternatively, the polymer solution is first coated on a polyester film, a polypropylene film or the like and the coated polymer film is laminated onto the photosensitive layer to transfer the coated polymer film to the photosensitive layer. The thickness of such a flexible layer may be within the range of from 0.05 to 30μ.

As the actinic radiation source that may be used to render the photosensitive elastomeric composition of the present invention solvent-insoluble, there can be mentioned, for example, a low pressure mercury lamp, a high pressure mercury lamp, an ultraviolet fluorescent lamp, a carbon arc lamp, a xenon lamp, a zirconium lamp and sun light.

An image is formed at the photosensitive elastomeric composition of the present invention by actinic radiation through an image-bearing transparency, and then, the unexposed area is dissolved away by a solvent. In this respect, it is necessary that this solvent dissolve the unexposed area but have hardly any influence on the exposed image area. As such a solvent, there can be mentioned, for example, 1,1,1-trichloroethane, tetrachloroethylene, trichloroethylene, tetrachloroethane, toluene and mixtures of such a solvent and 60% or less by weight of an alcohol such as ethanol, isopropanol or n-butanol. The unexposed area may be dissolved away by spraying such a solvent from a nozzle or brushing with a brush impregnated with such a solvent.

The photosensitive elastomeric composition of the present invention has excellent properties as a material for production of a flexographic printing plate. Besides, the composition of the present invention can be used for production of a photoresist or a screen for screen printing.

The present invention will now be described in detail by reference to the following Examples, which should not be construed to limit the scope of the present invention.

EXAMPLE 1

In 500 g of chloroform was dissolved 90 g of a polystyrene-polyisoprene-polystyrene block copolymer prepared according to the method as described in U.S. Pat. No. 3,265,765 (Styrene content: 14% by weight, Number average molecular weight measured according to the GPC method: 225,000), and 10 g of di-n-octyl fumarate, 2 g of benzoin isopropyl ether and 0.2 g of 2,6-di-t-butyl-p-cresol were incorporated and dissolved in the solution. The resulting liquid mixture was cast in a mold and allowed to stand at room temperature for 72 hours to evaporate the chloroform. Then, the residual mixture was heated at 40° C. in vacuo for 8 hours to remove the solvent completely and to obtain a sheet. Two pieces of 100μ-thick polyester films were laminated onto both the surfaces of the so formed sheet, and the sheet was placed inside a 2 mm spacer and pressed at 120° C. to form a photosensitive elastomeric layer. Then, the polyester film was stripped off from one surface of the photosensitive elastomeric layer, and an image-bearing transparency was closely contacted with the surface of the photosensitive elastomeric layer. The photosensitive elastomeric layer was exposed through the image-bearing transparency to actinic radiation having an intensity of 1.5 mW/cm$^2$ and emitted from an ultraviolet fluorescent lamp for 10 minutes. Then, the image-bearing transparency was removed, and the unexposed area was dissolved away and removed, using a brush, by a mixed solvent of 1,1,1-trichloroethane/isopropanol (2/1). Drying was conducted at 60° C. for 30 minutes. A relief having a high fidelity to the original transparency was obtained. It was found that the Shore hardness (A) of the so obtained relief was 43° as measured at 20° C., and when a 1 cm×6 cm solid part of the relief as cut was stretched at a rate of 50 cm/min by 100% relative to the original length using "Autograph P-100" (tradename of a tensile machine manufactured and sold by Shimadzu Seisakusho Ltd., Japan) and then released from the tensile force to effect elastic recovery, the residual deformation was less than 1%. It was confirmed that the relief had a rubber elasticity suitable for a flexographic printing plate.

EXAMPLE 2

In 600 g of 1,1,1-trichloroethane were dissolved 60 g of a polystyrene-polybutadiene-polystyrene block copolymer prepared according to the method as described in U.S. Pat. No. 3,265,765 (Styrene content: 30% by weight, Number average molecular weight measured according to the GPC method: 220,000), 15 g of distearyl fumarate, 25 g of "Polyoil 130" (tradename of a liquid 1,4-polybutadiene manufactured and sold by Nippon Zeon Co., Ltd., Japan), 2 g of benzoin methyl ether, 0.2 g of 2-ethylantraquinone and 0.1 g of p-methoxyphenol, and the resulting liquid mixture was cast in a mold and dried at 40° C. for 30 hours. The solvent was removed at 50° C. in vacuo over a period of 6 hours to obtain a sheet of a photosensitive elastomeric composition. The sheet was passed through a T-die extruder to convert it into a uniform sheet having a thickness of 2 mm. The sheet was cooled and two pieces of 100μ-thick polyester films were laminated onto both the surfaces of the sheet by roll laminating. Then, the polyester film was stripped off from one surface and an image-bearing transparency was closely contacted with the surface of the photosensitive layer, using a rubber roller. The photosensitive elastomeric composition sheet was placed at a distance of 20 cm from a light source composed of a bank of ten parallel 20 W ultraviolet fluorescent lamps and exposed to actinic radiation from the light source through the image-bearing transparency for 15 minutes. Then, the image-bearing transparency was removed and the unexposed area was dissolved away and removed, using a brush, by a mixed solvent of tetrachloroethylene/n-butanol (3/1). Then, the photosensitive composition layer was dried at 60° C. for 30 minutes and post-exposed to actinic radiation from the above light source for 10 minutes to obtain a printing plate having a high fidelity to the original transparency and a Shore hardness (A) of 55°. When flexographic printing was carried out using the so obtained printing plate, good prints were obtained.

EXAMPLE 3

800 g of the same polystyrene-polyisoprene-polystyrene block copolymer as used in Example 1, 100 g of bis(2-ethylhexyl) fumarate, 50 g of di-n-butyl fumarate, 150 g of naphthenic oil, 15 g of benzoin isobutyl ether and 1 g of pentaerythritol tetrakis[3'(3',5'-di-t-butyl-4'-hydroxy)phenylpropionate] were kneaded by an open roll to form a sheet. The sheet was passed through a T-die extruder to form a transparent uniform photosensitive elastomer sheet having a thickness of 2 mm. The extruded sheet was cooled and two pieces of 100μ-thick polyester films were laminated onto both the surfaces of the sheet by roll laminating. After the sheet had been stored at 50° C. for 1 month, both pieces of the polyester films were stripped off from both the surfaces of the sheet and a part of the photosensitive sheet was cut off and immersed in 1,1,1-trichloroethane. The cut piece was readily dissolved in the solvent and the insolubilized solid was not observed. In the same manner as described in Example 1, an image was formed and a printing plate was prepared using the above photosensitive elastomeric composition after 1 month's storage at 50° C. A relief having a high fidelity to the original transparency was obtained. When flexographic printing was carried out using this printing plate, good prints were obtained.

COMPARATIVE EXAMPLE 1

Photosensitive elastomeric compositions were prepared in the same manner as described in Example 1 except that 10 g of lauryl methacrylate and 10 g of diethylene glycol dimethacrylate were respectively used instead of 10 g of di-n-octyl fumarate. Each sheet was prepared from the resulting composition in the same manner as described in Example 1 and exposed to actinic radiation having an intensity of 1.5 mW/cm$^2$ from an ultraviolet fluorescent lamp for 10 minutes. Then, polyester films were stripped off from both the surfaces. A part of the photosensitive sheet was cut off and the cut piece was immersed in 1,1,1-trichloroethane. Both of the exposed photosensitive elastomeric composition of Example 1 including di-n-octyl fumarate and the exposed photosensitive elastomeric composition including diethylene glycol dimethacrylate were swollen but not dissolved in the solvent, but the exposed photosensitive elastomeric composition including lauryl methacrylate was dissolved in the solvent. From these experimental results, it was found that the reactivity of di-n-octyl fumarate is higher than that of lauryl methacrylate.

The 1 cm×6 cm cut sheet of the exposed photosensitive elastomeric composition of Example 1 including di-n-octyl fumarate and the 1 cm×6 cm cut sheet of the exposed photosensitive elastomeric composition including diethylene glycol dimethacrylate were immersed in a mixed solvent of isopropanol/ethyl acetate (4/1) for 24 hours. The so immersed sheets were each then stretched at a rate of 50 cm/min by 100% relative to the original length using the same tensile machine as described in Example 1 and released from the tensile force to effect elastic recovery. With respect to the exposed photosensitive elastomeric composition of Example 1 including di-n-octyl fumarate, the residual deformation was only 4%. But, with respect to the exposed photosensitive elastomeric composition including diethylene glycol dimethacrylate, the residual deformation was as large as 20%.

COMPARATIVE EXAMPLE 2

A sheet having a photosensitive elastomeric composition sheet layer and two pieces of 100μ-thick polyester film on both surfaces thereof was prepared in the same manner as described in Example 1 except that 10 g of tetraethylene glycol dimethacrylate was used instead of 10 g of di-n-octyl fumarate. Each of this sheet and the sheet of Example 1 was exposed to actinic radiation having an intensity of 1.5 mW/cm$^2$ from an ultraviolet fluorescent lamp for 10 minutes from the side of one surface and for additional 10 minutes from the side of the other surface. Then, the polyester films were stripped off and the remaining sheets were each immersed in various solvents to examine solvent resistances of each sheet. Each sheet was hardly swollen in isopropyl alcohol. When the sheets were immersed in ethyl acetate for 2 hours, the sheet of the composition of Example 1 was slightly swollen but retained its original shape, whereas the sheet of the composition including tetraethylene glycol dimethacrylate was destroyed and did not retain its original shape at all. From these experimental results, it was found that a fumaric acid ester has a higher reactivity than that of a methacrylic acid ester.

COMPARATIVE EXAMPLE 3

A sheet having a photosensitive elastomeric composition sheet layer and two pieces of 100μ-thick polyester films on both surfaces thereof was prepared in the same manner as described in Example 3 except that 100 g of 1,6-hexanediol diacrylate was used instead of 100 g of bis(2-ethylhexyl) fumarate. After the sheet had been stored at 50° C. for 1 month, the polyester films were stripped off from both the surfaces of the sheet. A part of the photosensitive layer was cut off and immersed in 1,1,1-trichloroethane. The cut piece was partially dissolved, but the majority was swollen but not dissolved and floated in the upper portion of the liquid. When it was intended to form an image on the photosensitive elastomeric composition sheet after 1 month's storage at 50° C. according to the method described in Example 1, a part of the unexposed area was not dissolved away at the solvent etching step, and the resulting printing plate did not have a fidelity to the original transparency and could not be used for the practical printing operation.

EXAMPLE 4 AND COMPARATIVE EXAMPLE 4

According to the method as described in Example 3, a photosensitive elastomeric composition sheet interposed between two pieces of 100μ-thick polypropylene films and having a thickness of 3 mm was prepared from 700 g of the same polystyrene-polyisoprene-polystyrene block copolymer as used in Example 1, 100 g of "Polyoil 130", 20 g of benzoin ethyl ether, 1 g of 2,6-di-t-butyl-p-cresol and an ethylenically unsaturated compound indicated in Table 1. The sheet was cut in half. One piece was stored at 50° C. for 1 month, and the polypropylene films were stripped off from both the surfaces. Then, a part of the photosensitive layer was cut and immersed in 1,1,1-trichloroethane and it was examined whether or not insolubilization occurred. The obtained results are shown in Table 1. In Table 1, compositions of Experiment Nos. 1 to 10 are photosensitive elastomeric compositions of the present invention. From the results shown in Table 1, it will readily be understood that these compositions of Experiment Nos. 1 to 10 are superior to photosensitive elastomeric compositions of Experiment Nos. 11 to 15 including an ethylenically unsaturated compound having an ethylenically unsaturated bond at the molecule terminals in respect of storage stability.

The other half of each photosensitive elastomeric composition that had not been used for the storage stability test was exposed to actinic radiation for 10 minutes and subjected to the solvent etching and drying treatment according to the method described in Example 1 to obtain a printing plate. Printing plates prepared from the photosensitive elastomeric compositions of Experiment Nos. 1 to 10 were superior or comparable to plates prepared from comparative samples of Experiment Nos. 11 to 15 with respect to properties required of flexographic printing plates, and these plates of the present invention gave very good prints when they were used for the flexographic printing.

Table 1

| Experiment No. | Ethylenically Unsaturated Compound | Amount (g) | Solubility in 1,1,1-Trichloroethane after 1 Month's Storage at 50° C. |
|---|---|---|---|
| 1 | di-n-butyl fumarate | 200 | completely dissolved |
| 2 | distearyl fumarate | 250 | completely dissolved |
| 3 | di-(n-octyl)fumarate | 300 | completely dissolved |
| 4 | n-butyl n-octyl fumarate | 300 | completely dissolved |
| 5 | dilauryl maleate | 200 | completely dissolved |
| 6 | dibenzyl maleate | 250 | completely dissolved |
| 7 | dilauryl fumarate | 300 | completely dissolved |
| 8 | diphenyl fumarate | 300 | completely dissolved |
| 9 | bis(6-phenylhexyl) fumarate | 300 | completely dissolved |
| 10 | bis(2-ethylhexyl) maleate | 250 | completely dissolved |
| 11 | 1,6-hexanediol diacrylate | 250 | insoluble |
| 12 | tetraethylene glycol diacrylate | 250 | insoluble |
| 13 | diallyl fumarate | 250 | insoluble |
| 14 | diethylene glycol dimethacrylate | 200 | insoluble |
| 15 | trimethylolpropane trimethacrylate | 50 | insoluble |
|    | trimethylolpropane triacrylate | 200 | |

EXAMPLE 5

A photosensitive elastomeric composition having the same recipe as that of the composition of Example 2 was prepared by mixing and kneading the ingredients by a kneader. The composition was interposed between two pieces of 100μ-thick polyester films and formed into a uniform sheet having a thickness of 3 mm, using a spacer, by a platen press. Then, the polyester film was stripped off from one side of the sheet, and a 100μ-thick polyester film having an adhesive layer composed of a urethane rubber type adhesive and having a thickness of 10μ was laminated on the sheet by a rubber roll so that the adhesive layer of the polyester film was contacted with the photosensitive elastomeric composition layer. Then, the polyester film on the opposite side was stripped off and a 100μ-thick polyester film coated with "Amilan CM-4000" (tradename of a soluble polyamide manufactured and sold by Toray Industries Inc., Japan) at a dry thickness of 0.5μ was laminated on the photosensitive elastomeric composition layer by a rubber roll so that the polyamide layer of the polyester film was contacted with the photosensitive elastomeric composition layer. Actinic radiation having an intensity of 2.0 mW/cm² from an ultraviolet fluorescent lamp was applied for 5 minutes to the photosensitive elastomeric composition layer from the side of the adhesive layer-having polyester film. When the soluble polyamide-coated polyester film was then stripped off, the soluble polyamide layer was transferred to and left on the surface of the photosensitive elastomeric composition layer. An image-bearing transparency was closely contacted with the polyamide-transferred surface and the photosensitive layer was exposed to actinic radiation having an intensity of 2.0 mW/cm² from the ultraviolet fluorescent lamp through the image-bearing transparency for 10 minutes. Then, the image-bearing transparency was removed and the unexposed area was dissolved away, using a brush, by a mixed solvent of 1,1,1-trichloroethane/isopropanol (2/1). Then, the sheet was dried at 60° C. for 30 minutes and post-exposed for 10 minutes to actinic radiation from the same light source. The so obtained plate had a high fidelity to the original transparency.

COMPARATIVE EXAMPLE 5

A polyurethane elastomer (A) was synthesized from 0.4 mole of a polyester having a number average molecular weight of 2,500 and containing hydroxyl groups at both the molecule terminals, which had been derived from propylene glycol and adipic acid, 0.5 mole of 1,4-butanediol and 0.88 mole of 2,6-toluylene diisocyanate according to customary procedures.

A polyurethane having isocyanate groups at both the molecule terminals was synthesized from 0.4 mole of a polyester having a number average molecular weight of 2,500 and containing hydroxyl groups at both the molecule terminals, which had been derived from propylene glycol and adipic acid, 0.48 mole of 1,6-hexanediol and 0.93 mole of 2,6-toluylene diisocyanate according to customary procedures, and this polyurethane was reacted with 2-hydroxypropyl methacrylate to obtain an unsaturated polyurethane elastomer (B) containing methacrylate groups at both the molecule terminals.

A polyurethane elastomer (C) was synthesized from 0.2 mole of a polyester having a number average molecular weight of 2,500 and containing hydroxyl groups at both the molecule terminals, which had been derived from propylene glycol and adipic acid, 0.25 mole of butene-1-diol-3,4, 0.25 mole of 1,4-butanediol and 0.68 mole of hexamethylene diisocyanate according to customary procedures.

A photosensitive polyurethane elastomeric composition was prepared from 100 g of each of the above polyurethane elastomers, 2 g of benzoin ethyl ether, 0.1 g of 2,6-di-t-butyl-p-cresol and 20 g of diethylene glycol dimethacrylate or di-n-octyl fumarate as an ethylenically unsaturated compound. A 20% by weight methyl ethyl ketone solution of the above composition was cast in a mold and the solvent was evaporated to form a sheet having a thickness of 0.5 mm. The sheet was placed at a distance of 20 cm from a light source consisting of a bank of ten parellel 20 W ultraviolet fluorescent lamps, and exposed to actinic radiation from this light source for 5 minutes. Then, the exposed sheet was washed with methyl ethyl ketone on the side opposite to the exposed side, and the degree of curing was examined to obtain the results shown in Table 2.

Table 2

| Experiment No. | Polyurethane Elastomer | Ethylenically Unsaturated Compound | Degree of Curing by Actinic Radiation |
|---|---|---|---|
| 1 | A | diethylene glycol dimethacrylate | substantially cured |
| 2 | A | di-n-octyl fumarate | not cured |
| 3 | B | diethylene glycol dimethacrylate | completely cured |
| 4 | B | di-n-octyl fumarate | semi-cured |
| 5 | C | diethylene glycol dimethacrylate | completely cured |
| 6 | C | di-n-octyl fumarate | semi-cured |

EXAMPLE 6

1, 100 g of a polystyrene-polybutadiene-polystyrene-polybutadiene block copolymer prepared using sec-butyl lithium as an initiator by living polymerization (Styrene content: 40% by weight, Number average molecular weight measured according to the GPC method: 200,000), 400 g of "Polyoil 130", 300 g of "Nisso PB B-3000" (tradename of a liquid 1,2-polybutadiene manufactured and sold by Nippon Soda Co., Ltd., Japan), 300 g of dilauryl fumarate, 30 g of 2,2-dimethoxyphenylacetophenone and 2 g of 2,6-di-t-butyl-p-cresol were mixed and kneaded using a kneader, formed into a ribbon using a roll mill and then formed into a uniform sheet having a thickness of 3 mm using a T-die extruder. After cooling, two pieces of 100μ-thick polyester films were laminated onto both the surfaces of the sheet. Image exposure, solvent etching, drying and post-exposure were conducted in the same manner as described in Example 2 to obtain a printing plate having a high fidelity to the original transparency and having a Shore hardness (A) of 45°. Flexographic printing was conducted using the so obtained printing plate to obtain good prints.

EXAMPLE 7

A uniform photosensitive sheet layer having a thickness of 3 mm and interposed between two pieces of 75μ-thick polyester films was prepared from 1,750 g of a polyisoprene-polysytrene-polyisoprene-polystyrene-polyisoprene block copolymer prepared using sec-butyl lithium as an initiator by living polymerization (Styrene content: 20% by weight, Number average molecular weight according to the GPC measurement: 300,000), 150 g of distearyl fumarate, 100 g of dibenzyl fumarate, 20 g of benzoin isobutyl ether and 1.5 g of p-methoxyphenol in the same manner as described in Example 3. The production of a printing plate was conducted in the same manner as described in Example 2 to obtain a printing plate having a high fidelity to the original transparency and having a Shore hardness (A) of 43°. Flexographic printing was conducted using the so obtained printing plate to obtain good prints.

EXAMPLE 8

A uniform photosensitive sheet layer having a thickness of 4 mm and interposed between two pieces of 75μ-thick polyester films was prepared from 1,200 g of a (polystyrene-polybutadiene)$_4$Si block copolymer obtained by inactivating with SiCl$_4$ polystyrene-polybutadiene anion radicals prepared using n-butyl lithium as an initiator by living polymerization (Styrene content: 35% by weight, Number average molecular weight according to the GPC measurement: 200,000), 500 g of "Polyoil 130", 300 g of distearyl fumarate, 20 g of benzoin ethyl ether and 2 g of p-methoxyphenol in the same manner as described in Example 6. The production of a printing plate was conducted in the same manner as described in Example 2 to obtain a printing plate having a high fidelity to the original transparency and having a Shore hardness (A) of 50°. Flexographic printing was conducted using the so obtained printing plate to obtain good prints.

What is claimed is:

1. A photosensitive elastomeric composition consisting essentially of 30 to 98% by weight of a component (a) comprising at least one thermoplastic elastomeric block copolymer represented by the following general formula:

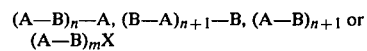

wherein A stands for a thermoplastic non-elastomeric polymer block having a glass transition temperature of 25° C. or more and a number average molecular weight of 2,000 to 100,000, B stands for an elastomeric polymer block having a glass transition temperature of 10° C. or less and a number average molecular weight of 25,000 to 1,000,000, X stands for Sn or Si, n is an integer of from 1 to 10, and m is 2 or 4, 1 to 50% by weight of a component (b) comprising at least one ethylenically unsaturated compound represented by the following general formula:

wherein $R^1$ and $R^2$, which may be the same or different, stand for a straight chain or branched alkyl group having 2 to 30 carbon atoms, an aryl group which is a phenyl group or a naphthyl group unsubstituted or substituted with one or two straight chain or branched alkyl groups having 1 to 6 carbon atoms or an aralkyl group represented by the formula $-(CH_2)_p-Ar$ wherein p is an integer of from 1 to 6 and Ar is a phenyl group unsubstituted or substituted with one or two straight chain or branched alkyl groups having 1 to 3 carbon atoms, and 0.01 to 10% by weight of a component (c) comprising a polymerization initiator.

2. A photosensitive elastomeric composition as claimed in claim 1, wherein said component (a) is at least one thermoplastic elastomeric block copolymer represented by the following general formula:

A—B—A, A—B—A—B or (A—B)$_4$—Si wherein A stands for polystyrene and B stands for polyisoprene or polybutadiene.

3. A photosensitive elastomeric composition as claimed in claim 1, wherein said ethylenically unsaturated compound (b) is at least one fumaric acid ester.

4. A photosensitive elastomeric composition as claimed in claim 1, wherein said component (b) is at least one ethylenically unsaturated compound represented by the following general formula:

wherein $R^1$ and $R^2$, which may be the same or different, stand for a straight chain or branched alkyl group having 4 to 18 carbon atoms or a benzyl group.

5. A photosensitive elastomeric composition as claimed in claim 4, wherein said component (b) is at least one ethylenically unsaturated compound represented by the following general formula:

wherein $R^1$ and $R^2$, which may be the same or different, stand for a straight chain or branched alkyl group having 8 to 18 carbon atoms.

6. A photosensitive elastomeric composition as claimed in claim 1, wherein said component (b) is at least one fumaric acid ester represented by the following general formula:

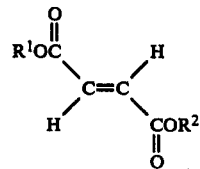

wherein $R^1$ and $R^2$, which may be the same or different, stand for a straight chain or branched alkyl group having 8 to 18 carbon atoms.

7. A photosensitive element comprising a support bearing a layer of a photosensitive elastomeric composition as claimed in claim 1.

8. A photosensitive element as claimed in claim 7, wherein said layer of the photosensitive elastomeric composition has a thickness of 0.5 to 7.0 mm.

9. A photosensitive element as claimed in claim 7, wherein a flexible cover sheet is present on the side of the photosensitive elastomeric composition layer remote from the support.

10. A photosensitive element as claimed in claim 9, wherein a flexible polymeric film is interposed between the cover sheet and the surface of the photosensitive elastomeric composition layer.

* * * * *